US010935607B2

(12) United States Patent
Tashiro

(10) Patent No.: US 10,935,607 B2
(45) Date of Patent: Mar. 2, 2021

(54) CONTROL DEVICE FOR SECONDARY BATTERY, CONTROL METHOD OF SECONDARY BATTERY, BATTERY SYSTEM, AND MOTOR-DRIVEN VEHICLE

(71) Applicant: TOYOTA JIDOSHA KABUSHIKI KAISHA, Toyota (JP)

(72) Inventor: Hiroki Tashiro, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 142 days.

(21) Appl. No.: 16/378,998

(22) Filed: Apr. 9, 2019

(65) Prior Publication Data
US 2019/0324093 A1 Oct. 24, 2019

(30) Foreign Application Priority Data

Apr. 24, 2018 (JP) ................................. 2018-082886

(51) Int. Cl.
*G01R 31/3842* (2019.01)
*H01M 10/44* (2006.01)
*B60L 58/13* (2019.01)
*H01M 10/42* (2006.01)

(52) U.S. Cl.
CPC .......... *G01R 31/3842* (2019.01); *B60L 58/13* (2019.02); *H01M 10/425* (2013.01); *H01M 10/441* (2013.01); *H01M 2010/4271* (2013.01); *H01M 2220/20* (2013.01)

(58) Field of Classification Search
CPC ............ G01R 31/3842; H01M 10/441; H01M 2010/4271; H01M 2220/20; H01M 10/42; H01M 10/425; H01M 10/48; H01M 10/44; Y02E 60/10; Y02T 10/7072; Y02T 90/14; Y02T 10/70; B60L 58/12; B60L 58/16; B60L 3/12; B60L 58/10; B60L 58/13
USPC ........................................................ 320/132
See application file for complete search history.

(56) References Cited

U.S. PATENT DOCUMENTS

| | | | | |
|---|---|---|---|---|
| 8,336,651 | B2* | 12/2012 | Nishi | B60L 15/20 180/65.29 |
| 9,059,595 | B2* | 6/2015 | Kikuchi | H02J 7/0091 |
| 9,272,635 | B2* | 3/2016 | Izumi | H01M 10/48 |
| 9,815,383 | B2* | 11/2017 | Komiyama | H02J 7/0063 |

(Continued)

FOREIGN PATENT DOCUMENTS

| | | |
|---|---|---|
| JP | 2014-007079 A | 1/2014 |
| JP | 2016-167368 A | 9/2016 |

*Primary Examiner* — M Baye Diao
(74) *Attorney, Agent, or Firm* — Sughrue Mion, PLLC

(57) ABSTRACT

In a control device for a secondary battery, the secondary battery includes a monitoring sensor that detects battery information. An electronic control unit is configured to store first information. The electronic control unit is configured to set a lower-limit state of charge. The electronic control unit is configured to calculate a value of a rate of decrease of a full charging capacity using a value of the full charging capacity and to calculate a value of a state-of-charge variation using the value of the rate of decrease of the full charging capacity and the first information. The electronic control unit is configured to increase the lower-limit state of charge when the value of the state-of-charge variation is greater than a threshold value and to maintain the lower-limit state of charge when the value of the state-of-charge variation is less than the threshold value.

5 Claims, 9 Drawing Sheets

(56) References Cited

U.S. PATENT DOCUMENTS

| | | | |
|---|---|---|---|
| 9,919,710 B2 * | 3/2018 | Murata | B60W 30/192 |
| 10,587,129 B2 * | 3/2020 | Shirai | B60L 58/20 |
| 2016/0264017 A1 | 9/2016 | Komiyama | |

* cited by examiner

CONTROL DEVICE FOR SECONDARY BATTERY, CONTROL METHOD OF SECONDARY BATTERY, BATTERY SYSTEM, AND MOTOR-DRIVEN VEHICLE

INCORPORATION BY REFERENCE

The disclosure of Japanese Patent Application No. 2018-082886 filed on Apr. 24, 2018 including the specification, drawings and abstract is incorporated herein by reference in its entirety.

BACKGROUND

1. Technical Field

The disclosure relates to a control device for a secondary device, a control method of a secondary battery, a battery system, and a motor-driven vehicle.

2. Description of Related Art

Motor-driven vehicles in which a battery pack in which a plurality of secondary batteries which are stacked in a predetermined direction are clamped by a clamping band is mounted have spread recently. By applying a clamping load to the battery pack using the clamping band, the plurality of secondary batteries are held without slipping down. In such motor-driven vehicles, various measures are taken to hold the secondary batteries even when the volume of each secondary battery decreases due to deterioration of the battery pack or the like.

For example, Japanese Unexamined Patent Application Publication No. 2014-7079 (JP 2014-7079 A) discloses that a minimum state of charge (SOC) in which a predetermined load allowing a plurality of secondary batteries of a battery pack not to slip down can be applied is set as a lower-limit SOC. By performing control such that a battery pack is used between an upper-limit SOC and a lower-limit SOC, it is possible to secure a load in which a secondary battery does not slip down.

SUMMARY

It is known that the volume of a secondary battery decreases due to deterioration thereof. That is, the volume of a secondary battery decreases from the volume in an initial state due to deterioration such as aging deterioration. Therefore, it is conceivable that a clamping load which is applied to a battery pack could be set on the assumption that a secondary battery will have deteriorated most in a prescribed period (for example, a guarantee period of the battery pack). That is, a clamping load of the battery pack in the initial state is set such that a load with which the secondary batteries can be held is applied even when the volume of a plurality of secondary batteries is the smallest in the prescribed period. In this case, the clamping load which is set in the initial state in which a volume decrease has not been caused may be excessively high. In order to set the clamping load of the battery pack in the initial state to be larger, a withstanding load, creep resistance, and the like of components of the battery pack need to be increased to prevent damage of the components and there is concern that costs thereof will increase.

In a secondary battery, it is known that a negative-electrode active material expands due to charging and a negative-electrode active material contracts due to discharging. That is, the volume of a secondary battery can vary depending on a charging state thereof. When a second battery is used in a range between an upper-limit SOC and a lower-limit SOC, the volume at the lower-limit SOC is the minimum. Therefore, it is conceivable that a decrease in volume due to deterioration of a secondary battery could be predicted and the lower-limit SOC of a battery pack be set to be high in advance. However, when the lower-limit SOC is set to be high, the volume of a secondary battery at the time of deterioration thereof can be secured, but there is concern that a service range of the battery pack (a range between the upper-limit SOC and the lower-limit SOC) may be narrowed and a possible cruising range of a motor-driven vehicle be shortened.

The disclosure is for preventing a secondary battery from slipping down without causing a decrease in service range of a battery pack and an increase in manufacturing costs thereof.

A first aspect of the disclosure is a control device for a secondary battery. The secondary battery includes a monitoring sensor configured to detect battery information. The control device includes an electronic control unit configured to control the secondary battery such that charging and discharging are performed in a range between an upper-limit state of charge and a lower-limit state of charge of the secondary battery. The electronic control unit is configured to store first information indicating a relationship between a rate of decrease of a full charging capacity of the secondary battery and a state-of-charge variation of the secondary battery. The state-of-charge variation is a deviation of a correspondence between an average state of charge in an active material of a positive electrode and a specific average state of charge in an active material of a negative electrode from the correspondence in an initial state. The electronic control unit is configured to set the lower-limit state of charge. The electronic control unit is configured to acquire the battery information detected by the monitoring sensor and to calculate a value of the full charging capacity of the secondary battery using the battery information. The electronic control unit is configured to calculate a value of the rate of decrease of the full charging capacity using the value of the full charging capacity and to calculate a value of the state-of-charge variation using the value of the rate of decrease of the full charging capacity and the first information. The electronic control unit is configured to increase the lower-limit state of charge when the value of the state-of-charge variation is greater than a threshold value and to maintain the lower-limit state of charge when the value of the state-of-charge variation is less than the threshold value.

A correspondence mismatch is known as a main cause why the volume of a secondary battery decreases. A correspondence mismatch means that an average state of charge in an active material of a positive electrode relative to a specific average state of charge in an active material of a negative electrode deviates from an initial state of the secondary battery. When a correspondence mismatch occurs, a negative-electrode state of charge (SOC) corresponding to a set lower-limit SOC (for example, a battery SOC in which an open-circuit voltage (OCV) is 3 V) can decrease. When the negative-electrode SOC corresponding to the lower-limit SOC decreases, a negative-electrode volume decreases and thus the volume of the secondary battery at the lower-limit SOC decreases. Therefore, when a relationship between the state-of-charge variation indicating an amount of correspondence mismatch and a decrease in volume of the secondary battery is calculated in advance, it is possible to estimate a decrease in volume of the secondary battery by calculating the state-of-charge variation. With this configuration, the state-of-charge variation is calculated and the lower-limit SOC is increased when the calculated state-of-charge variation is greater than a threshold value. By setting a threshold value in correlation with a limit volume which is a minimum volume in which the secondary battery does not slip down and comparing the threshold value with the state-of-charge variation, it is possible to determine whether the volume of the secondary battery is less than the limit volume. When the state-of-charge variation becomes greater than the threshold value due to deterioration of the secondary battery, it is determined (estimated) that the volume of the secondary battery is less than the limit volume and the lower-limit SOC is increased. Accordingly, in the initial state, a maximum value of a volume decrease due to deterioration of the secondary battery does not need to be set to a predicted clamping load. Therefore, it is not necessary to take measures for increasing withstanding loads, creep resistance, and the like of components which are used for the secondary battery. Since the lower-limit SOC of the secondary battery in the initial state does not need to be set to be unnecessarily high, it is possible to avoid excessive narrowing of a service range of the secondary battery in the initial state.

In the control device, the electronic control unit may be configured to store second information indicating a relationship between the value of the state-of-charge variation and an increase of the lower-limit state of charge to be increased. The electronic control unit may be configured to set the increase of the lower-limit state of charge using the value of the state-of-charge variation and the second information when the value of the state-of-charge variation is greater than the threshold value.

With this configuration, when the calculated state-of-charge variation is greater than the threshold value, an increase of the lower-limit SOC corresponding to the calculated state-of-charge variation is set using the calculated state-of-charge variation and second information which is determined by experiment or the like in advance. For example, the increase of the lower-limit SOC may be set based on the state-of-charge variation such that the volume of the secondary battery is equal to or greater than the limit volume and is close to the limit volume. Accordingly, it is possible to maintain a load which does not cause the secondary battery to slip down without excessively narrowing a service range of the secondary battery due to the increase in the lower-limit SOC.

A second aspect of the disclosure is a control method of a second battery. The secondary battery includes a monitoring sensor configured to detect battery information and an electronic control unit configured to control the secondary battery such that charging and discharging are performed in a range between an upper-limit state of charge and a lower-limit state of charge of the secondary battery. The control method includes: acquiring, by the electronic control unit, the battery information detected by the monitoring sensor; calculating, by the electronic control unit, a value of a full charging capacity of the secondary battery using the battery information; calculating, by the electronic control unit, a value of a rate of decrease of the full charging capacity using the value of the full charging capacity; calculating, by the electronic control unit, a value of a state-of-charge variation using the value of the rate of decrease of the full charging capacity and information indicating a relationship between a predetermined rate of decrease of the full charging capacity of the secondary battery and a predetermined state-of-charge variation of the secondary battery, the state-of-charge variation being a deviation of a correspondence between an average state of charge in an active material of a positive electrode and a specific average state of charge in an active material of a negative electrode from the correspondence in an initial state; increasing, by the electronic control unit, the lower-limit state of charge when the value of the state-of-charge variation is greater than a threshold value; and maintaining, by the electronic control unit, the lower-limit state of charge when the value of the state-of-charge variation is less than the threshold value.

With this configuration, the state-of-charge variation is calculated and the lower-limit SOC is increased when the calculated state-of-charge variation is greater than a threshold value. By setting a threshold value in correlation with a limit volume which is a minimum volume in which the secondary battery does not slip down and comparing the threshold value with the state-of-charge variation, it is possible to determine whether the volume of the secondary battery is less than the limit volume. When the state-of-charge variation becomes greater than the threshold value due to deterioration of the secondary battery, it is determined (estimated) that the volume of the secondary battery is less than the limit volume and the lower-limit SOC is increased. Accordingly, in the initial state, a maximum value of a volume decrease due to deterioration of the secondary battery does not need to be set to a predicted clamping load. Therefore, it is not necessary to take measures for increasing withstanding loads, creep resistance, and the like of components which are used for the secondary battery. Since the lower-limit SOC of the secondary battery in the initial state does not need to be set to be unnecessarily high, it is possible to avoid excessive narrowing of a service range of the secondary battery in the initial state.

A third aspect of the disclosure is a battery system. The battery system includes a second battery, a monitoring sensor, and an electronic control unit. The monitoring sensor is configured to detect battery information of the secondary battery. The electronic control unit is configured to control the secondary battery such that charging and discharging are performed in a range between an upper-limit state of charge and a lower-limit state of charge of the secondary battery. The electronic control unit is configured to store information indicating a relationship between a rate of decrease of a full charging capacity of the secondary battery and a state-of-charge variation of the secondary battery. The state-of-charge variation is a deviation of a correspondence between an average state of charge in an active material of a positive electrode and a specific average state of charge in an active material of a negative electrode from the correspondence in an initial state. The electronic control unit is configured to acquire the battery information detected by the monitoring sensor and to calculate a value of the full charging capacity of the secondary battery using the battery information. The electronic control unit is configured to calculate a value of the rate of decrease of the full charging capacity using the value of the full charging capacity and to calculate a value of the state-of-charge variation using the value of the rate of decrease of the full charging capacity and the information. The electronic control unit is configured to increase the lower-limit state of charge when the value of the state-of-charge variation is greater than a threshold value and to maintain the lower-limit state of charge when the value of the state-of-charge variation is less than the threshold value.

With this configuration, the state-of-charge variation is calculated and the lower-limit SOC is increased when the calculated state-of-charge variation is greater than a threshold value. By setting a threshold value in correlation with a limit volume which is a minimum volume in which the secondary battery does not slip down and comparing the threshold value with the state-of-charge variation, it is possible to determine whether the volume of the secondary battery is less than the limit volume. When the state-of-charge variation becomes greater than the threshold value due to deterioration of the secondary battery, it is determined (estimated) that the volume of the secondary battery is less than the limit volume and the lower-limit SOC is increased. Accordingly, in the initial state, a maximum value of a volume decrease due to deterioration of the secondary battery does not need to be set to a predicted clamping load. Therefore, it is not necessary to take measures for increasing withstanding loads, creep resistance, and the like of components which are used for the secondary battery. Since the lower-limit SOC of the secondary battery in the initial state does not need to be set to be unnecessarily high, it is possible to avoid excessive narrowing of a service range of the secondary battery in the initial state.

A fourth aspect of the disclosure is a motor-driven vehicle. The motor-driven vehicle includes a battery system. The battery system includes a secondary battery, a monitoring sensor, and an electronic control unit. The monitoring sensor is configured to detect battery information of the secondary battery. The electronic control unit is configured to control the secondary battery such that charging and discharging are performed in a range between an upper-limit state of charge and a lower-limit state of charge of the secondary battery. The electronic control unit is configured to store information indicating a relationship between a rate of decrease of a full charging capacity of the secondary battery and a state-of-charge variation of the secondary battery. The state-of-charge variation is a deviation of an average state of charge in an active material of a positive electrode relative to a specific average state of charge in an active material of a negative electrode from an initial state. The electronic control unit is configured to acquire the battery information detected by the monitoring sensor and to calculate a value of the full charging capacity of the secondary battery using the battery information. The electronic control unit is configured to calculate a value of the rate of decrease of the full charging capacity using the value of the full charging capacity and to calculate a value of the state-of-charge variation using the value of the rate of decrease of the full charging capacity and the information. The electronic control unit is configured to increase the lower-limit state of charge when the value of the state-of-charge variation is greater than a threshold value and to maintain the lower-limit state of charge when the value of the state-of-charge variation is less than the threshold value.

With this configuration, the state-of-charge variation is calculated and the lower-limit SOC is increased when the calculated state-of-charge variation is greater than a threshold value. By setting a threshold value in correlation with a limit volume which is a minimum volume in which the secondary battery does not slip down and comparing the threshold value with the state-of-charge variation, it is possible to determine whether the volume of the secondary battery is less than the limit volume. When the state-of-charge variation becomes greater than the threshold value due to deterioration of the secondary battery, it is determined (estimated) that the volume of the secondary battery is less than the limit volume and the lower-limit SOC is increased. Accordingly, in the initial state, a maximum value of a volume decrease due to deterioration of the secondary battery does not need to be set to a predicted clamping load. Therefore, it is not necessary to take measures for increasing a withstanding load and creep resistance of components which are used for the secondary battery. Since the lower-limit SOC of the secondary battery in the initial state does not need to be set to be unnecessarily high, it is possible to avoid excessive narrowing of a service range of the secondary battery in the initial state.

With the aspects of the disclosure, it is possible to prevent a secondary battery from slipping down without causing a decrease in service range of a battery pack and an increase in manufacturing costs thereof.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
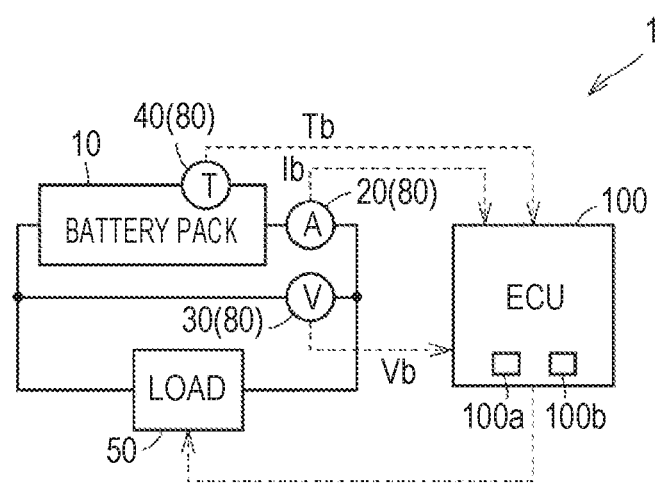
FIG. 1 is a diagram schematically illustrating a configuration of a battery system according to an embodiment.

Hereinafter, embodiments of the disclosure will be described in detail with reference to the accompanying drawings. In the drawings, the same or corresponding elements will be referred to by the same reference signs and description thereof will not be repeated.

FIG. 1 is a diagram schematically illustrating a configuration of a battery system 1 according to an embodiment of the disclosure. The battery system 1 includes a battery pack 10 and an electronic control unit (ECU) 100 which is a control device. The battery system 1 is mounted in a motor-driven vehicle such as an electric vehicle, a hybrid vehicle, and a fuel-cell vehicle.

The battery pack 10 supplies electric power for driving a load 50. The load 50 includes, for example, a running electric motor which is mounted in the motor-driven vehicle and a power conversion device that is supplied with electric power from the battery pack 10 to drive the running electric motor. The battery pack 10 is charged with regenerative power from the electric motor.

Figure 2:
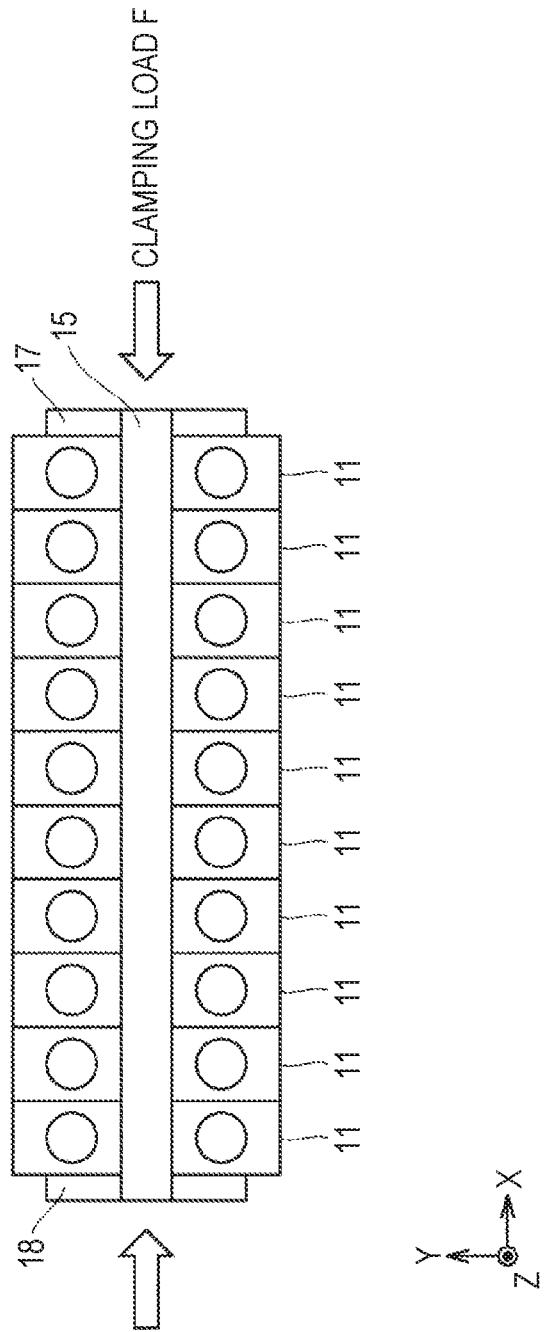
FIG. 2 is a diagram schematically illustrating a configuration of a battery pack according to the embodiment.

As illustrated in FIG. 2, the battery pack 10 includes a plurality of unit cells 11, a pair of end plates 17 and 18, and a clamping band 15.

Each unit cell 11 is, for example, a secondary battery such as a nickel-hydride battery or a lithium ion battery. The unit cell may be a cell including a liquid electrolyte between a positive electrode and a negative electrode or may be a cell (an all-solid battery) including a solid electrolyte therebetween. In this embodiment, it is assumed that the unit cell 11 is a lithium ion battery.

In the example illustrated in FIG. 2, the unit cells 11 are stacked in an X-axis direction (a stacking direction) in FIG. 2 and are electrically connected in series. The end plates 17 and 18 are disposed on end faces of the unit cells 11 at both ends in the stacking direction. By connecting the end plate 17 and the end plate 18 using the clamping band 15, the plurality of unit cells 11 are fixed by the end plates 17 and 18 and the clamping band 15 in a state in which a predetermined clamping load F is applied thereto in the X-axis direction.

Referring back to FIG. 1, the battery system 1 further includes a monitoring sensor 80 including a current sensor 20, a voltage sensor 30, and a temperature sensor 40. The current sensor 20 detects a current which is input and output to and from the battery pack 10, and outputs a signal indicating a detection result Ib thereof to the ECU 100. The voltage sensor 30 detects a voltage of the battery pack 10 and outputs a signal indicating a detection result Vb thereof to the ECU 100. The temperature sensor 40 detects a temperature of the battery pack 10 and outputs a signal indicating a detection result Tb thereof to the ECU 100. In the following description, the detection value Ib of the current sensor 20, the detection value Vb of the voltage sensor 30, and the detection value Tb of the temperature sensor 40 are collectively referred to as "battery information."

The ECU 100 includes a central processing unit (CPU) 100a, a memory (more specifically, a read only memory (ROM) and a random access memory (RAM)) 100b, and an input and output port (not illustrated) for inputting and outputting various signals. The ECU 100 controls devices based on signals from the sensors and the devices and maps and programs stored in the memory. These various controls are not limited to processes based on software and may be performed by dedicated hardware (an electronic circuitry).

The ECU 100 controls charging and discharging of the battery pack 10 based on the current Ib acquired from the current sensor 20 and the voltage Vb acquired from the voltage sensor 30. The ECU 100 calculates a state of charge (SOC) of the battery pack 10 using the current Ib and the voltage Vb. Various known methods such as a current integration method and a method using an SOC-OCV (Open Circuit Voltage) curve can be used to calculate the SOC.

The ECU 100 sets an upper-limit SOC and a lower-limit SOC and performs charging and discharging of the battery pack 10 in a range between the set upper-limit SOC and the set lower-limit SOC (a service range).

The ECU 100 calculates a full charging capacity of the battery pack 10. For example, the full charging capacity can be calculated by dividing a value ΣI acquired by integrating a current flowing in the battery pack 10 by an SOC variation ΔSOC of the battery pack 10 calculated from change of an open-circuit voltage in a certain period (for example, a period from a time point at which the full charging capacity has been calculated previously to a time point at which the full charging capacity is currently calculated). A well-known method can be used as the method of calculating the full charging capacity and another method may be used.

Figure 3:
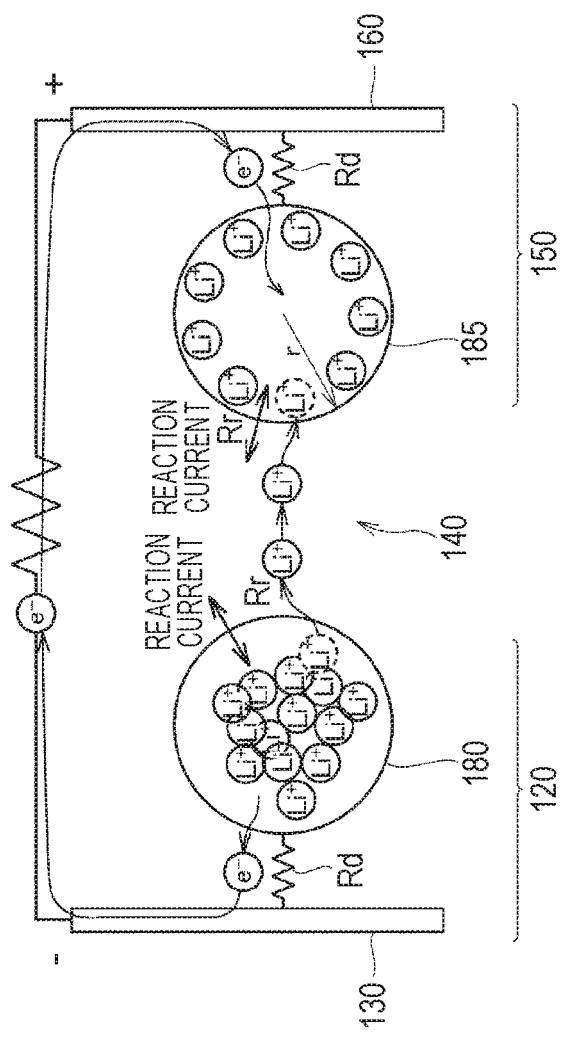
FIG. 3 is a conceptual diagram schematically illustrating an internal configuration of a unit cell.

FIG. 3 is a conceptual diagram schematically illustrating an internal configuration of a unit cell 11. The unit cell 11 includes a negative electrode 120, a separator 140 including an electrolyte solution, and a positive electrode 150. Each of the negative electrode 120 and the positive electrode 150 is formed of an active material aggregate. An active material 185 of the positive electrode 150 and an active material 180 of the negative electrode 120 include lithium ions $Li^+$ and electrons $e^-$.

A current-collector board 130 that absorbs electrons from the active material 180 is provided in the negative electrode 120, and a current-collector board 160 that discharges electrons to the active material 185 is provided in the positive electrode 150. The current-collector board 130 of the negative electrode 120 is formed of, for example, copper and is connected to a negative electrode terminal. The current-collector board 160 of the positive electrode 150 is formed of, for example, aluminum and is connected to a positive electrode terminal. Lithium ions $Li^+$ are exchanged between the positive electrode 150 and the negative electrode 120 via the separator 140, thus a charging current or a discharge current are generated, and charging and discharging of the unit cell 11 are performed.

Specifically, when the unit cell 11 is being discharged, lithium ions $Li^+$ are discharged from an interface of the active material 180 of the negative electrode 120, and the discharged lithium ions $Li^+$ are adsorbed onto an interface of the active material 185 of the positive electrode 150 via the separator 140. At this time, electrons move from the negative electrode to the positive electrode via the current-collector boards 130 and 160. Accordingly, a discharging current is generated. The charged state in the unit cell 11 varies depending on a lithium ion concentration distribution in the active materials 180 and 185 of the positive electrode 150 and the negative electrode 120.

An output power Vb1 of the unit cell 11 is expressed by Equation (1). An OCV denotes an open-circuit voltage of the unit cell 11, Rb1 denotes an internal resistance of the unit cell 11, and Ib1 denotes a current flowing in the unit cell 11. The resistance Rb1 includes a pure electrical resistance Rd associated with movement of electrons $e^-$ in the negative electrode 120 and the positive electrode 150 and a charge transfer resistance Rr acting equivalently as an electrical resistance when a reaction current is generated on the active material interface.

$$Vb1 = OCV(\theta p, \theta n) - Rb1 \times Ib1 \quad (1)$$

A positive-electrode SOC θp denotes a ratio of a local lithium ion concentration (an average value) Cp on the active material interface of the positive electrode to a limit lithium ion concentration Cpmax in the active material of the positive electrode. The limit lithium ion concentration Cpmax is a maximum lithium ion concentration which can be received by the active material of the positive electrode. A negative-electrode SOC θn denotes a ratio of a local lithium ion concentration (an average value) Cn on the active material interface of the negative electrode to a limit lithium ion concentration Cnmax in the active material of the negative electrode. The limit lithium ion concentration Cnmax is a maximum lithium ion concentration which can be received by the active material of the negative electrode.

The positive-electrode SOC θp and the negative-electrode SOC θn are expressed by Equations (2) and (3).

$$\theta p = Cp/Cp\text{max} \quad (2)$$

$$\theta n = Cn/Cn\text{max} \quad (3)$$

The positive-electrode SOC θp and the negative-electrode SOC θn decrease when lithium ions Li⁺ are discharged and increase when lithium ions Li⁺ are received. That is, the negative-electrode SOC θn increases when the unit cell 11 is charged and decreases when the unit cell 11 is discharged. The positive-electrode SOC θp decreases when the unit cell 11 is charged and increases when the unit cell 11 is discharged. The resistance Rb1 has characteristics that vary depending on changes of the positive-electrode SOC θp, the negative-electrode SOC θn, and the temperature of the unit cell 11. In other words, the resistance Rb1 can be expressed as a function of the positive-electrode SOC θp, the negative-electrode SOC θn, and the temperature of the unit cell 11.

Figure 4:
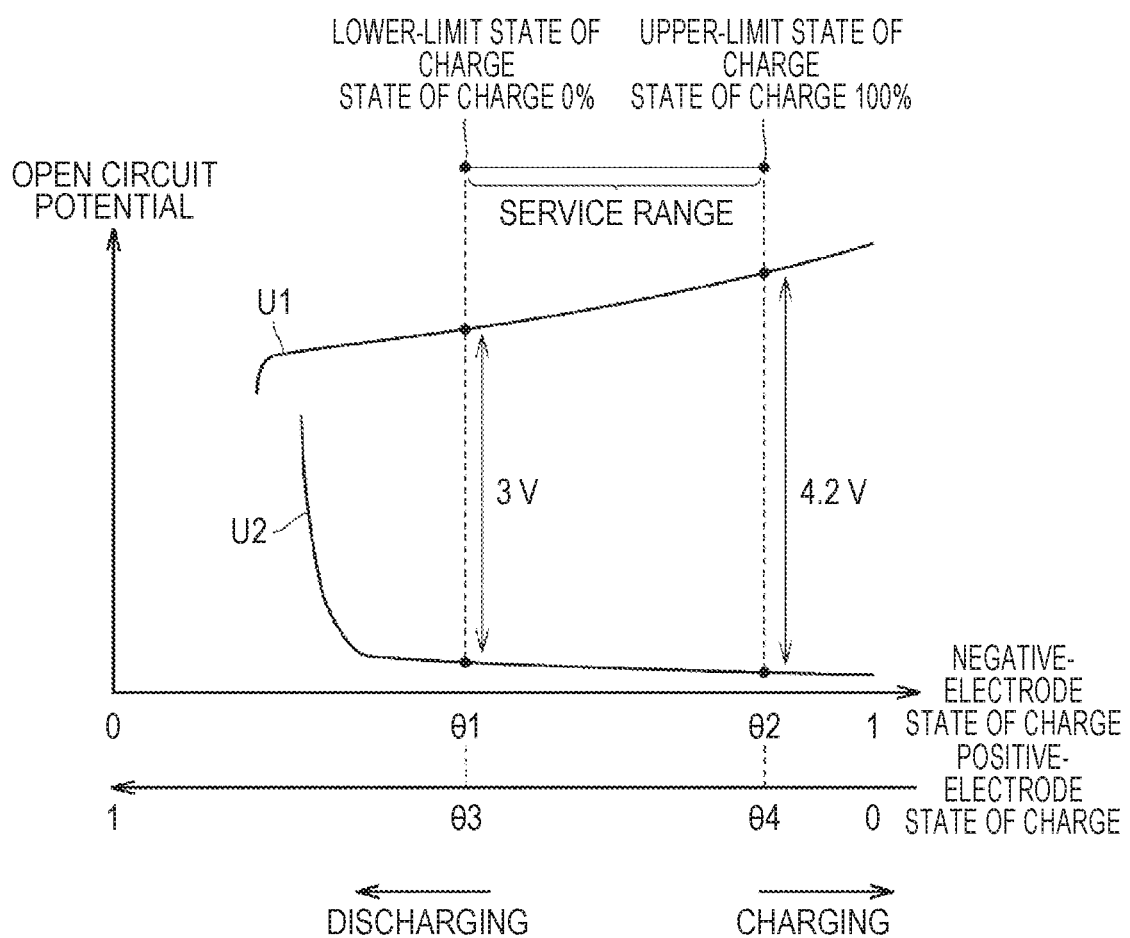
FIG. 4 is a diagram schematically illustrating a relationship between a negative-electrode SOC and a positive-electrode SOC and an open-circuit potential OCP.

A relationship between a negative-electrode and a positive-electrode SOC and an open-circuit potential OCP will be described now. FIG. 4 is a diagram schematically illustrating a relationship between a negative-electrode and a positive-electrode SOC and an open-circuit potential OCP. The diagram illustrated in FIG. 4 is acquired as a diagram indicating a characteristic variation of a positive-electrode open-circuit potential with respect to the positive-electrode SOC θp and a characteristic variation of a negative-electrode open-circuit potential with respect to a variation of the negative-electrode SOC θn, for example, by measuring a relationship between the positive-electrode SOC θp and the positive-electrode open-circuit potential and a relationship between the negative-electrode SOC θn and the negative-electrode open-circuit potential in an initial state of the unit cell 11. The initial state refers to a state in which deterioration of the unit cell 11 is not caused.

When a unit cell 11 is in an initial state, the limit lithium ion concentration Cpmax in the active material of the positive electrode and the limit lithium ion concentration Cnmax in the active material of the negative electrode are the same (Cpmax=Cnmax). Therefore, in a charged state in which all lithium ions Li⁺ are located on the negative electrode side, the negative-electrode SOC θn is 1 (Cn=Cnmax) and the positive-electrode SOC θp is 0 (Cp=0). On the other hand, in a discharged state in which all lithium ions Li⁺ are located on the positive electrode side, the positive-electrode SOC θp is 1 (Cp=Cpmax) and the negative-electrode SOC θn is 0 (Cn=0).

A curve U1 in FIG. 4 denotes the positive-electrode open-circuit potential (OCP) and a curve U2 denotes the negative-electrode open-circuit potential (OCP). A difference between the curve U1 and the curve U2 is the open-circuit voltage OCV of the unit cell 11. As illustrated in FIG. 4, the difference between the curve U1 and the curve U2 increases as the negative-electrode SOC θn goes in a charging direction.

In this embodiment, it is assumed that the SOC of the unit cell 11 when the open-circuit voltage OCV is 3 V (hereinafter, the SOC of the unit cell 11 is also referred to as a "battery SOC") is 0% and the battery SOC when the open-circuit voltage OCV is 4.2 V is 100%. The battery SOC 100% is set to the upper-limit SOC and the battery SOC 0% is set to the lower-limit SOC. The unit cell 11 is controlled by the ECU 100 such that it is used in a range between the upper-limit SOC and the lower-limit SOC (a service range). As illustrated in FIG. 4, the negative-electrode SOC θn when the open-circuit voltage OCV is 3 V is θ1, and the negative-electrode SOC θn when the open-circuit voltage OCV is 4.2 V is θ2. The positive-electrode SOC θp when the open-circuit voltage OCV is 3 V is θ3, and the positive-electrode SOC θp when the open-circuit voltage OCV is 4.2 V is θ4.

It is generally known that a secondary battery deteriorates over time depending on the use conditions and the time for which it has been used and the full charging capacity thereof decreases. It is also known that the decrease in full charging capacity of a secondary battery is generated mainly due to a "decrease in single-electrode capacity" in the positive electrode and the negative electrode and a "correspondence mismatch" between the positive electrode and the negative electrode.

The "decrease in single-electrode capacity" refers to a decrease in a receiving capability for lithium ions Li⁺ in each of the positive electrode and the negative electrode, that is, a decrease in limit lithium ion concentration Cpmax or Cnmax in the active material of each of the positive electrode and the negative electrode.

The "correspondence mismatch" means that a combination of the composition of the positive electrode (the positive-electrode SOC θp) and the composition of the negative electrode (the negative-electrode SOC θn) deviates from the initial state of the unit cell 11, that is, the positive-electrode SOC θp relative to a specific negative-electrode SOC θn deviates from the initial state of the unit cell 11, when a set of the positive electrode and the negative electrode is used as a battery. This will be specifically described below. As described above, when the unit cell 11 is in the initial state, the positive-electrode SOC θp is 1 (a discharged state) when the negative-electrode SOC θn is 0, and the positive-electrode SOC θp is 0 (a charged state) when the negative-electrode SOC θn is 1. That is, an amount of lithium ions Li⁺ discharged from one electrode and an amount of lithium ions Li⁺ received by the other electrode are the same. When the unit cell 11 deteriorates, the correspondence between the negative-electrode SOC θn and the positive-electrode SOC θp may vary. As one reason for this, for example, it is thought that lithium ions Li⁺ become inert (1) when lithium ions Li⁺ discharged from the negative electrode are used in a coating formed on the surface of the positive electrode, (2) when lithium ions Li⁺ discharged from the positive electrode are extracted as metallic lithium on the negative electrode, and the like. (1) and (2) will be described below.

The case in which lithium ions Li⁺ discharged from the negative electrode are used in a coating formed on the surface of the positive electrode specifically means that lithium ions Li⁺ become inert compounds by a chemical reaction and form a coating on the surface of the positive electrode. In this case, lithium ions Li⁺ used to form the coating cannot contribute to charging and discharging thereafter. At this time, since lithium ions Li⁺ are discharged from the negative electrode, the negative-electrode SOC θn decreases. However, since the positive electrode does not adsorb lithium ions Li⁺, the positive-electrode SOC θp does not vary. Therefore, the combination between the positive-electrode SOC θp and the negative-electrode SOC θn deviates from the initial state of the unit cell 11.

The case in which lithium ions Li⁺ discharged from the positive electrode are extracted as metallic lithium on the negative electrode specifically means that lithium ions Li⁺ are not adsorbed onto the active material of the negative electrode and are extracted as metallic lithium on the surface of the negative electrode. In this case, lithium ions Li⁺ extracted as metallic lithium cannot contribute to charging and discharge thereafter. At this time, since lithium ions Li⁺ are discharged from the positive electrode, the positive-electrode SOC θp decreases. However, since lithium ions Li⁺ are not adsorbed onto the negative electrode, the negative-electrode SOC θn does not vary. Therefore, the combination between the positive-electrode SOC θp and the negative-electrode SOC θn deviates from the initial state of the unit cell 11.

In this way, a correspondence mismatch may be caused in the cases of (1) and (2). The correspondence between the negative-electrode SOC θn and the positive-electrode SOC θp when a correspondence mismatch has occurred will be described below with reference to FIG. 5.

Figure 5:
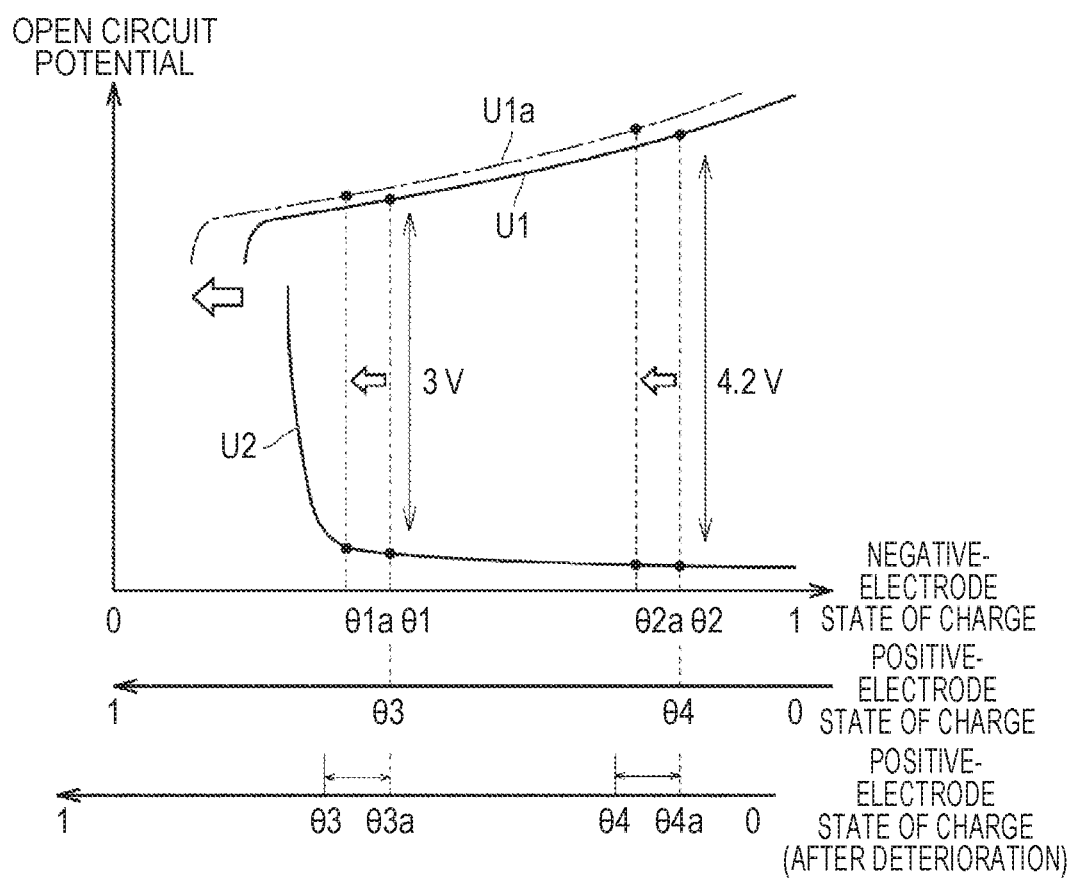
FIG. 5 is a diagram schematically illustrating a correspondence mismatch between a positive electrode and a negative electrode.

FIG. 5 is a diagram schematically illustrating a correspondence mismatch between the positive electrode and the negative electrode. In FIG. 5, a curve U1 deviates from a curve U2 to a curve U1a. The curve U1a is obtained by moving the curve U1 in parallel in the direction of an arrow in FIG. 5. The horizontal axis in FIG. 5 represents the negative-electrode SOC, the positive-electrode SOC, and the positive-electrode SOC after deterioration. When the cases of (1) and (2) are considered with reference to FIG. 5, the curve U1 (the positive electrode) deviates from the curve U2 (the negative electrode) in the direction of the arrow in FIG. 5 in any case. This is because the negative-electrode SOC θn decreases with respect to the positive-electrode SOC θp in the case of (1) and the positive-electrode SOC θp decreases with respect to the negative-electrode SOC θn in the case of (2).

In FIG. 5, for example, the positive-electrode SOC corresponding to the negative-electrode SOC θ1 is θ3 when the unit cell 11 is in the initial state and is θ3a after the correspondence mismatch has occurred. Similarly, the positive-electrode SOC corresponding to the negative-electrode SOC θ2 is θ4 when the unit cell 11 is in the initial state and is θ4a after the correspondence mismatch has occurred. In the following description, a deviation of the positive-electrode SOC θp with respect to a specific negative-electrode SOC θn from the initial state when the correspondence mismatch has occurred is also referred to as an "SOC variation." Referring to the specific example illustrated in FIG. 5, a difference between the positive-electrode SOC θ3 and the positive-electrode SOC θ3a or a difference between the positive-electrode SOC θ4 and the positive-electrode SOC θ4a is the SOC variation.

As described above, the difference between the curve U1 and the curve U2 is the open-circuit voltage OCV of the unit cell 11. Accordingly, when the correspondence mismatch occurs, the position at which the open-circuit voltage OCV is 3 V deviates in the direction in which the negative-electrode SOC θn decreases (the direction of the arrow in FIG. 5). That is, the negative-electrode SOC θn corresponding to the lower-limit SOC (OCV=3 V) decrease from the initial state. As illustrated in FIG. 5, the negative-electrode SOC θn corresponding to the lower-limit SOC (OCV=3 V) is θ1 in the initial state and deviates to θ1a after the correspondence mismatch has occurred. Similarly, regarding the upper-limit SOC (OCV=4.2 V), the negative-electrode SOC θn corresponding to the upper-limit SOC is θ2 in the initial state and deviates to θ2a after the correspondence mismatch has occurred.

In a secondary battery (a unit cell 11), it is known that a negative-electrode active material expands due to charging and the negative-electrode active material contracts due to discharging. That is, a negative-electrode volume increases when the negative-electrode SOC θn increases and the negative-electrode volume decreases when the negative-electrode SOC θn decreases. Therefore, a volume variation occurs in the secondary battery depending on the negative-electrode SOC θn and the volume at the lower-limit SOC is the minimum when the secondary battery is used between the upper-limit SOC and the lower-limit SOC.

As described above, when the correspondence mismatch occurs due to deterioration of the unit cell 11, the negative-electrode SOC θn corresponding to the lower-limit SOC (OCV=3 V) decreases. Accordingly, the volume of the negative electrode at the lower-limit SOC after the correspondence mismatch has occurred can be less than the volume of the negative electrode at the lower-limit SOC in the initial state. That is, the volume at the lower-limit SOC can decrease due to deterioration of the unit cell 11.

Figure 6:
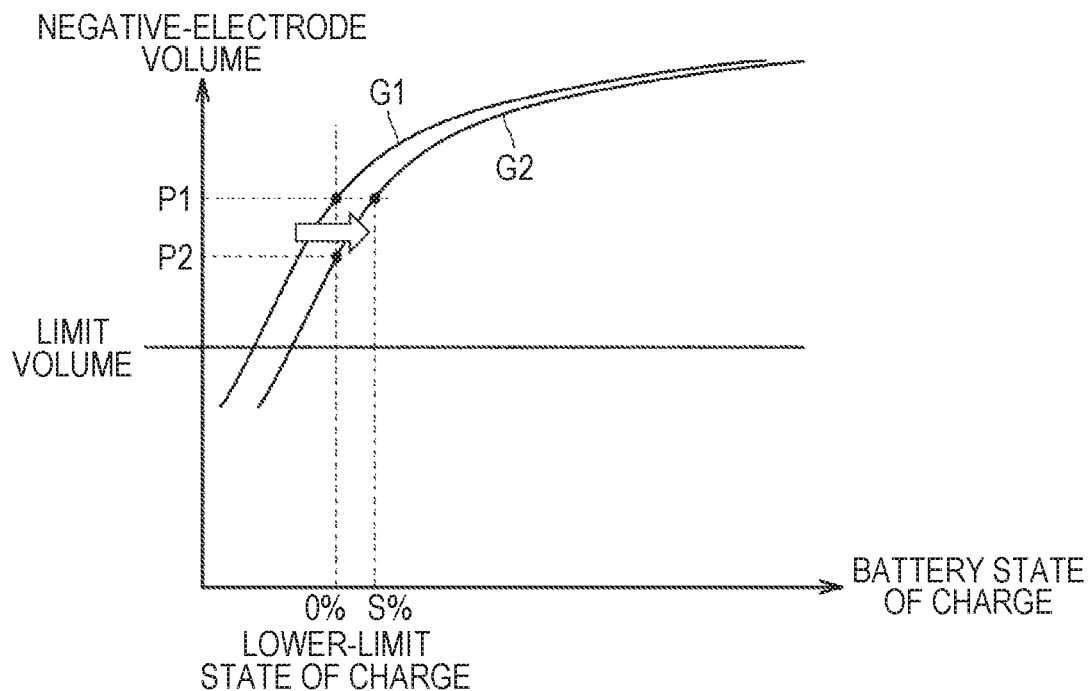
FIG. 6 is a diagram illustrating a relationship between a battery SOC and a negative-electrode volume in a unit cell.

FIG. 6 is a diagram illustrating a relationship between the battery SOC and the negative-electrode volume in a unit cell 11. In FIG. 6, the horizontal axis represents the battery SOC and the vertical axis represents the negative-electrode volume. A curve G1 in FIG. 6 indicates a relationship between the battery SOC of the unit cell 11 and the negative-electrode volume in the initial state. The negative-electrode volume decreases as the battery SOC decreases. The limit volume illustrated in FIG. 6 is a minimum volume in which each unit cell 11 is guaranteed not to slip down by the clamping load F of the battery pack 10. As illustrated in FIG. 6, the negative-electrode volume at the lower-limit SOC of the unit cell 11 in the initial state is P1.

A curve G2 indicates a relationship between the battery SOC of the unit cell 11 and the negative-electrode volume after deterioration. The curve G2 is obtained by deviating the curve G1 in the direction of an arrow in FIG. 6. The reason why the curve G1 deviates to the curve G2 is as follows. In the initial state, the battery SOC when the negative-electrode volume is P1 is 0% (the lower-limit SOC). On the other hand, when the correspondence mismatch has occurred, the position at which the battery SOC is 0% deviates as described above with reference to FIG. 5 and thus the battery SOC when the negative-electrode volume is P1 increases from the initial state. Accordingly, the curve G1 deviates in the direction of the arrow in FIG. 6 due to occurrence of the correspondence mismatch. In the example illustrated in FIG. 6, the battery SOC after the correspondence mismatch has occurred is S % (S>0).

In FIG. 6, the negative-electrode volume at the lower-limit SOC of the unit cell 11 after deterioration is P2 which is less than P1 (P1>P2). This is because the negative-electrode SOC corresponding to the lower-limit SOC decreases due to occurrence of the correspondence mismatch as described above. In this way, the negative-electrode volume at the lower-limit SOC (the volume of the unit cell 11) decreases due to occurrence of the correspondence mismatch. In FIG. 6, the volume of the negative electrode at the lower-limit SOC decreases to P2 due to occurrence of the correspondence mismatch, and P2 is greater than the limit volume and thus the unit cell 11 is in the range in which it is held without slipping down.

On the other hand, it is conceivable that the volume of the negative electrode at the lower-limit SOC is less than the limit volume due to occurrence of the correspondence mismatch. A curve G3 in FIG. 7 indicates the relationship between the battery SOC and the negative-electrode volume when the unit cell 11 further deteriorates. When the unit cell 11 further deteriorates, the SOC variation due to occurrence of the correspondence mismatch increases and thus a decrease of the negative-electrode SOC corresponding to the lower-limit SOC can increase. As a result, the negative-electrode volume at the lower-limit SOC is P3 which is less than the limit volume (limit volume>P3). In this case, there is a likelihood that the unit cell 11 will slip down.

The battery pack 10 which is mounted in a motor-driven vehicle or the like is held such that a unit cell 11 does not slip down by stacking a plurality of unit cells 11 in the stacking direction and clamping the unit cells 11 using the clamping band 15 to apply a predetermined clamping load F thereto as described above. The clamping load F which is applied to the battery pack 10 is set, for example, in consideration of a prescribed period (for example, a guarantee period of the battery pack 10), a volume decrease of the plurality of unit cells 11 (the battery pack 10) due to aging deterioration which is assumed in the prescribed period, and the like. In the following description, the sum of the volume decrease of the unit cells 11 is also referred to as a "volume decrease of the battery pack 10."

Figure 7:
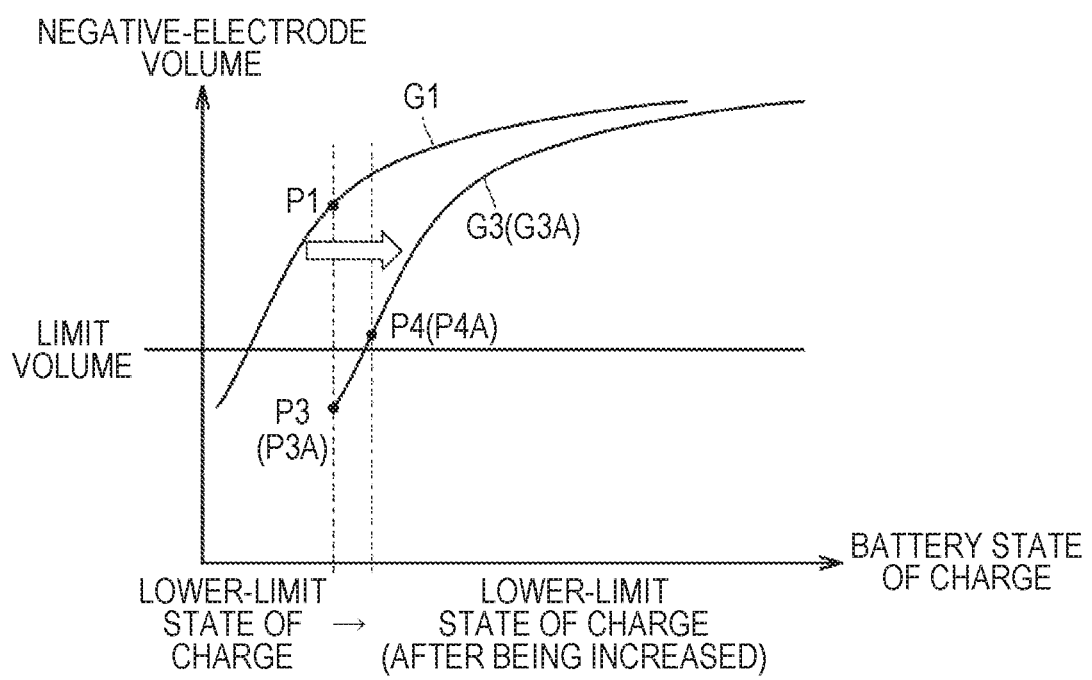
FIG. 7 is another diagram illustrating a relationship between a battery SOC and a negative-electrode volume in a unit cell.

The case illustrated in FIG. 7 can be conceived, for example, in consideration of a maximum value of the volume decrease of the battery pack 10 due to aging deterioration which is assumed in the prescribed period. In order to prevent the unit cells 11 from slipping down even when the volume decrease of the battery pack 10 is the maximum value, it is necessary to set the clamping load F of the battery pack 10 in the initial state to be large. Even when a longer guarantee period is set, it is necessary to set the clamping load F of the battery pack 10 in the initial state to be large. In order to set the clamping load F of the battery pack 10 to be large, withstanding load and creep resistance of each component which is used in the battery pack 10 need to be increased to prevent destruction of the component, and there is concern that costs thereof will increase.

As illustrated in FIG. 7, it is also conceivable that a decrease in volume due to deterioration (the correspondence mismatch) of the unit cells 11 is predicted and the lower-limit SOC of the battery pack 10 (the unit cells 11) is set to be high in advance. However, when the lower-limit SOC is set to be high, the service range of the battery pack 10 in a state in which the volume decrease is small is narrowed and thus there is concern that the possible cruising range of the motor-driven vehicle will be shorted.

Therefore, in this embodiment, the volume of the battery pack 10 is estimated using the pre-calculated relationship between the SOC variation M and the negative-electrode volume of the battery pack 10 by calculating an SOC variation M indicating the magnitude of the correspondence mismatch of the battery pack 10. When the estimated negative-electrode volume of the battery pack 10 is equal to or less than the limit volume, that is, when the calculated SOC variation M is greater than a threshold value Mth, the lower-limit SOC of the battery pack 10 is increased based on the calculated SOC variation M. In this way, the lower-limit SOC is maintained when the estimated volume is equal to or greater than the limit volume, and the lower-limit SOC is increased such that the volume is not less than the limit volume when the estimated volume is a volume (a volume less than the limit volume) in which there is a likelihood that the unit cells 11 will slip down.

Figure 8:
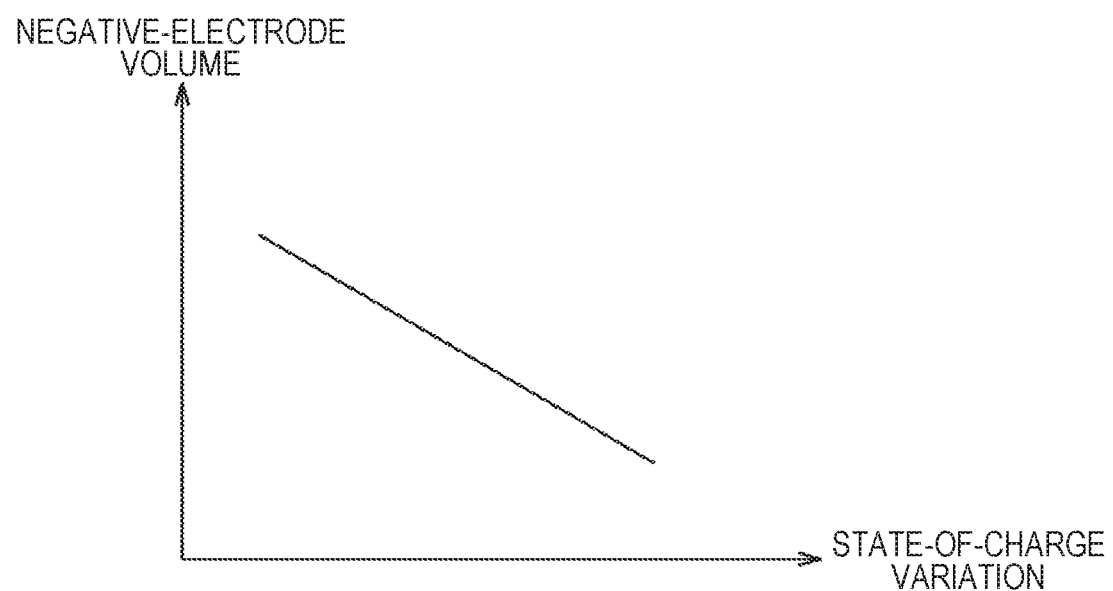
FIG. 8 is a diagram illustrating a relationship between an SOC variation and a negative-electrode volume of a battery pack 10.

The relationship between the SOC variation M and the negative-electrode volume of the battery pack 10 is calculated in advance by experiment or the like and is stored as a third map in the memory 100*b* of the ECU 100. FIG. 8 is a diagram illustrating the relationship between the SOC variation M and the negative-electrode volume of the battery pack 10 at the lower-limit SOC. As illustrated in FIG. 8, the relationship between the SOC variation M and the negative-electrode volume of the battery pack 10 refers to a relationship in which the negative-electrode volume of the battery pack 10 decreases as the SOC variation M increases. When the SOC variation M is known, the negative-electrode volume of the battery pack 10 at the lower-limit SOC can be estimated using the third map.

According to this embodiment, when the SOC variation M is greater than the threshold value Mth due to deterioration of the battery pack 10 (when the negative-electrode volume of the battery pack 10 is equal to or less than the limit volume), the lower-limit SOC is increased and thus the clamping load F of the battery pack 10 which is set in the initial state in which there is no volume decrease does not need to be set to be excessively large. Therefore, it is not necessary to increase withstanding loads and creep resistance of components which are used in the battery pack 10. Since the lower-limit SOC of the battery pack 10 in the initial state does not need to be increased, it is possible to avoid excessive narrowing of the service range of the battery pack 10 in the initial state.

A lower-limit SOC increase H has a value which is arbitrarily set such that the negative-electrode volume is equal to or greater than the limit volume, and it is preferable that the negative-electrode volume be set to be equal to or greater than the limit volume and close to the limit volume. By setting the lower-limit SOC increase H such that the negative-electrode volume is equal to or greater than the limit volume and close to the limit volume, it is possible to curb narrowing of the service range of the battery pack 10 as much as possible due to the increase of the lower-limit SOC.

A method of calculating the SOC variation M in this embodiment will be described below. The inventor of the disclosure noticed that occurrence ratios of the "decrease in single-electrode capacity" and the "correspondence mismatch" in the decrease in full charging capacity of a unit cell 11 are almost constant regardless of sampling of the unit cell 11. Therefore, the occurrence ratio of the "decrease in single-electrode capacity" and the "correspondence mismatch" is calculated in advance by experiment or the like. Then, the magnitude of the correspondence mismatch (the SOC variation) with respect to a rate of decrease of full charging capacity D is calculated in advance, for example, using the SOC variation due to occurrence of the "correspondence mismatch" which is calculated by experiment or the like, the full charging capacity decrease D, and the occurrence ratio of the "correspondence mismatch." That is, the relationship between the rate of decrease of full charging capacity D and the SOC variation M is calculated in advance. The rate of decrease of full charging capacity D refers to a ratio of the full charging capacity of the battery pack 10 which is currently calculated with respect to the full charging capacity of the battery pack 10 in the initial state. When information indicating the relationship between the rate of decrease of full charging capacity D and the SOC variation M is stored as a first map in the memory 100*b* of the ECU 100, the SOC variation M can be calculated using the first map by calculating the full charging capacity decrease D. Although not illustrated, the first map refers to a relationship in which the SOC variation M increases as the rate of decrease of full charging capacity D increases.

Figure 9:
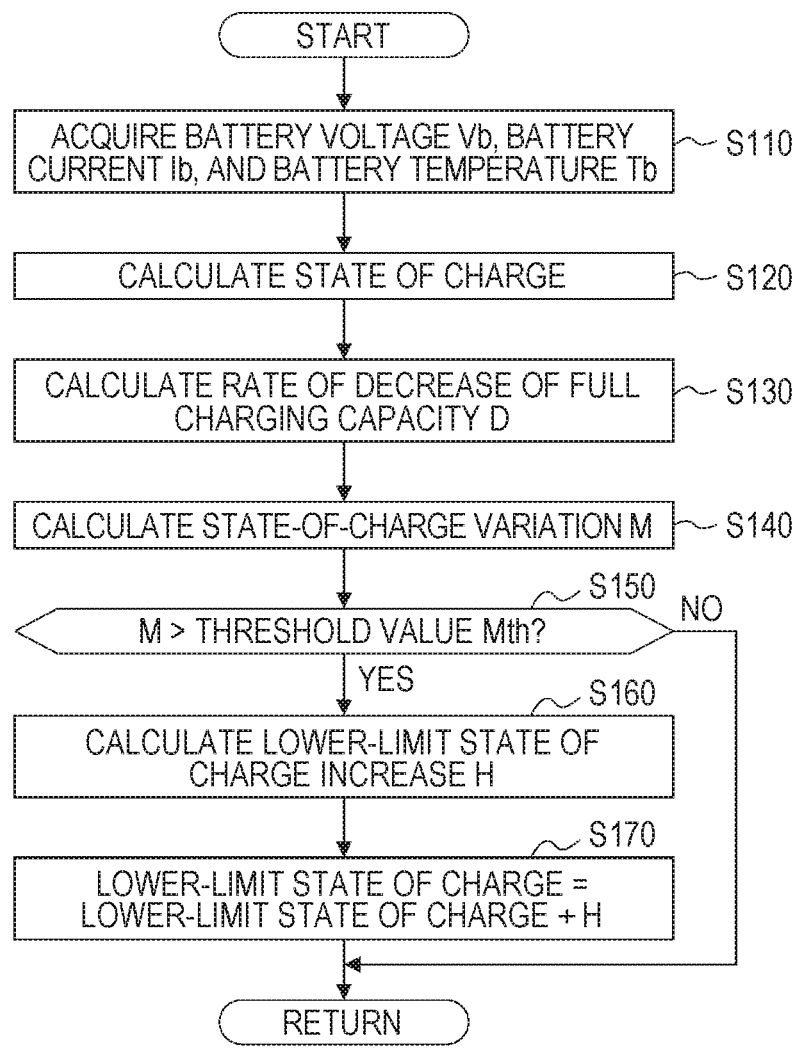
FIG. 9 is a flowchart illustrating an example of a process flow for increasing a lower-limit SOC which is performed by an ECU according to the embodiment.

FIG. 9 is a flowchart illustrating an example of a process flow of increasing the lower-limit SOC which is performed by the ECU 100 according to this embodiment. This flowchart is called and performed every predetermined calculation cycle by the ECU 100. The steps of the flowchart illustrated in FIG. 9 are performed in software by the ECU 100, but some or all thereof may be embodied in hardware (electric circuitry) which is incorporated in the ECU 100.

The ECU 100 acquires detected values Ib, Vb, and Tb (battery information) from the current sensor 20, the voltage sensor 30, and the temperature sensor 40 (Step 110, in which Step is abbreviated to "S" in the following description).

The ECU 100 calculates the SOC of the battery pack 10 using the battery information acquired in S110 (S120). Various known methods such as a current integration method and a method using an SOC-OCV curve can be used as the method of calculating the SOC.

Subsequently, the ECU 100 calculates the full charging capacity of the battery pack 10 and calculates the rate of decrease of full charging capacity D (S130). Various known methods can be used to calculate the full charging capacity and the full charging capacity can be calculated, for example, by dividing a value ΣI acquired by integrating a current flowing in the battery pack 10 by the SOC variation ΔSOC of the battery pack 10 calculated from a variation of the open-circuit voltage in a certain period (for example, a period from a time point at which the full charging capacity was previously calculated to a time point at which the full charging capacity is currently calculated). The ECU 100 calculates the rate of decrease of full charging capacity D from the full charging capacity of the battery pack 10 in the initial state and the full charging capacity of the battery pack 10 which is currently estimated.

Subsequently, the ECU 100 calculates the SOC variation M (S140). The ECU 100 calculates the SOC variation M, for example, using the rate of decrease of full charging capacity D calculated in Step S130 and the first map stored in the memory 100b.

The ECU 100 determines whether the SOC variation M is greater than a threshold value Mth (S150). The threshold value Mth is a value which is set in association with the limit volume of the battery pack 10 and is compared with the SOC variation M. The threshold value Mth indicates that the negative-electrode volume of the battery pack 10 is less than the limit volume when the SOC variation M is greater than the threshold value Mth.

When the SOC variation M is equal to or less than the threshold value Mth (NO in S150), the ECU 100 determines that the negative-electrode volume of the battery pack 10 is not less than the limit volume and the unit cells 11 can be held without slipping down, skips the subsequent steps, and ends the process flow.

When the SOC variation M is greater than the threshold value Mth (YES in S150), the ECU 100 calculates a lower-limit SOC increase H (S160). Here, the lower-limit SOC increase H is a value which is set based on the SOC variation M. The relationship between the SOC variation M and the lower-limit SOC increase H is calculated in advance by experiment or the like, and information indicating the relationship between the SOC variation M and the lower-limit SOC increase H to be increased is stored as a second map in the memory 100b of the ECU 100. An example thereof is illustrated in FIG. 10

Figure 10:
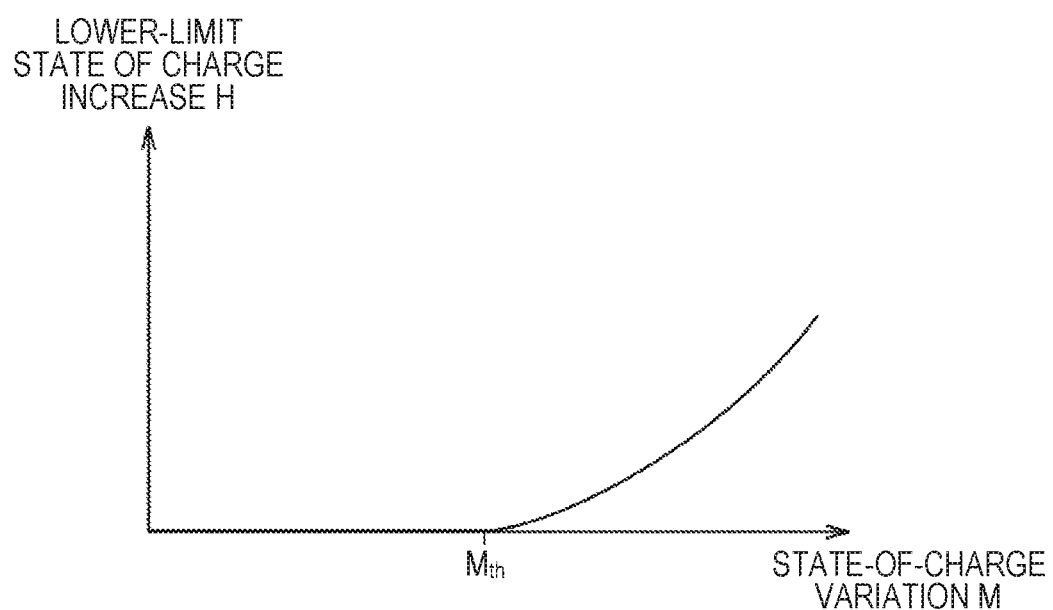
FIG. 10 is a diagram illustrating a lower-limit SOC increase relative to an SOC variation.

FIG. 10 is a diagram (a second map) illustrating the lower-limit SOC increase H with respect to the SOC variation M. In FIG. 10, the vertical axis represents the lower-limit SOC increase H and the horizontal axis represents the SOC variation M. The second map illustrated in FIG. 10 indicates that the lower-limit SOC is maintained when the SOC variation M is equal to or less than the threshold value Mth (the lower-limit SOC increase H=0) and the lower-limit SOC increase H is set depending on the SOC variation M when the SOC variation M is greater than the threshold value Mth. In other words, the lower-limit SOC is maintained when the negative-electrode volume of the battery pack 10 is not less than the limit volume, and the lower-limit SOC increase H is set such that the negative-electrode volume of the battery pack 10 is equal to or greater than the limit volume when the negative-electrode volume of the battery pack 10 is less than the limit volume. The second map in this embodiment is an example of "second information" in the claims.

In this embodiment, the lower-limit SOC increase H is set based on the SOC variation M such that the negative-electrode volume at the lower-limit SOC after the lower-limit SOC has been increased is equal to or greater than the limit volume and close to the limit volume. Accordingly, it is possible to curb narrowing of the service range of the battery pack 10 due to an increase of the lower-limit SOC as much as possible.

Referring back to FIG. 9, the ECU 100 adds the lower-limit SOC increase H calculated in S160 to the lower-limit SOC and sets a new lower-limit SOC (S170). Accordingly, thereafter, the battery pack 10 is used in the range between the upper-limit SOC and the new lower-limit SOC. Accordingly, it is possible to prevent the negative-electrode volume of the battery pack 10 from becoming less than the limit volume and to prevent the unit cells 11 from slipping down.

As described above, in this embodiment, the SOC variation M of the battery pack 10 is calculated, and the lower-limit SOC is increased based on the calculated SOC variation M when the calculated SOC variation M is greater than the threshold value Mth (when the negative-electrode volume of the battery pack 10 is estimated to be less than the limit volume due to deterioration). Accordingly, it is not necessary to set the clamping load F of the battery pack 10, which is set in the initial state in which a decrease in volume has not occurred, to be excessively large and it is not necessary to take measures for enhancing withstanding loads and creep resistance of components which are used in the battery pack 10. Since the lower-limit SOC of the battery pack 10 in the initial state does not need to be increased, it is possible to avoid excessive narrowing of the service range of the battery pack 10 in the initial state. Since the lower-limit SOC is increased based on the calculated SOC variation M, it is possible to minimize the width by which the service range of the battery pack 10 is narrowed due to the increase of the lower-limit SOC.

It should be noted that the above-mentioned embodiment is merely exemplary in all respects but is not restrictive. The scope of the disclosure is defined by the appended claims, not by the above-mentioned description of the embodiment and includes all modifications within the meaning and scope equivalent to the claims.

What is claimed is:

1. A control device for a secondary battery,
the secondary battery including a monitoring sensor configured to detect battery information,
the control device comprising an electronic control unit configured to control the secondary battery such that charging and discharging are performed in a range between an upper-limit state of charge and a lower-limit state of charge of the secondary battery,
the electronic control unit being configured to store first information indicating a relationship between a rate of decrease of a full charging capacity of the secondary battery and a state-of-charge variation of the secondary battery, the state-of-charge variation being a deviation of a correspondence between an average state of charge in an active material of a positive electrode and a specific average state of charge in an active material of a negative electrode from the correspondence in an initial state;

the electronic control unit being configured to set the lower-limit state of charge;

the electronic control unit being configured to acquire the battery information detected by the monitoring sensor and to calculate a value of the full charging capacity of the secondary battery using the battery information;

the electronic control unit being configured to calculate a value of the rate of decrease of the full charging capacity using the value of the full charging capacity and to calculate a value of the state-of-charge variation using the value of the rate of decrease of the full charging capacity and the first information; and the electronic control unit being configured to increase the lower-limit state of charge when the value of the state-of-charge variation is greater than a threshold value and to maintain the lower-limit state of charge when the value of the state-of-charge variation is less than the threshold value.

2. The control device according to claim 1, wherein:

the electronic control unit is configured to store second information indicating a relationship between the state-of-charge variation and an increase of the lower-limit state of charge to be increased; and the electronic control unit is configured to set the increase of the lower-limit state of charge using the value of the state-of-charge variation and the second information when the value of the state-of-charge variation is greater than the threshold value.

3. A control method of a secondary battery, the secondary battery including a monitoring sensor configured to detect battery information and an electronic control unit configured to control the secondary battery such that charging and discharging are performed in a range between an upper-limit state of charge and a lower-limit state of charge of the secondary battery, the control method comprising:

acquiring, by the electronic control unit, the battery information detected by the monitoring sensor;

calculating, by the electronic control unit, a value of a full charging capacity of the secondary battery using the battery information;

calculating, by the electronic control unit, a value of a rate of decrease of the full charging capacity using the value of the full charging capacity;

calculating, by the electronic control unit, a value of a state-of-charge variation using the value of the rate of decrease of the full charging capacity and information indicating a relationship between a predetermined rate of decrease of the full charging capacity of the secondary battery and a predetermined state-of-charge variation of the secondary battery, the state-of-charge variation being a deviation of a correspondence between an average state of charge in an active material of a positive electrode and a specific average state of charge in an active material of a negative electrode from the correspondence in an initial state;

increasing, by the electronic control unit, the lower-limit state of charge when the value of the state-of-charge variation is greater than a threshold value; and maintaining, by the electronic control unit, the lower-limit state of charge when the value of the state-of-charge variation is less than the threshold value.

4. A battery system comprising:

a secondary battery;

a monitoring sensor configured to detect battery information of the secondary battery; and an electronic control unit configured to control the secondary battery such that charging and discharging are performed in a range between an upper-limit state of charge and a lower-limit state of charge of the secondary battery, the electronic control unit being configured to store information indicating a relationship between a rate of decrease of a full charging capacity of the secondary battery and a state-of-charge variation of the secondary battery, the state-of-charge variation being a deviation of a correspondence between an average state of charge in an active material of a positive electrode and a specific average state of charge in an active material of a negative electrode from the correspondence in an initial state;

the electronic control unit being configured to acquire the battery information detected by the monitoring sensor and to calculate a value of the full charging capacity of the secondary battery using the battery information;

the electronic control unit being configured to calculate a value of the rate of decrease of the full charging capacity using the value of the full charging capacity and to calculate a value of the state-of-charge variation using the value of the rate of decrease of the full charging capacity and the information; and the electronic control unit being configured to increase the lower-limit state of charge when the value of the state-of-charge variation is greater than a threshold value and to maintain the lower-limit state of charge when the value of the state-of-charge variation is less than the threshold value.

5. A motor-driven vehicle comprising a battery system including a secondary battery, a monitoring sensor, and an electronic control unit, the monitoring sensor being configured to detect battery information of the secondary battery;

the electronic control unit being configured to control the secondary battery such that charging and discharging are performed in a range between an upper-limit state of charge and a lower-limit state of charge of the secondary battery, wherein:

the electronic control unit being configured to store information indicating a relationship between a rate of decrease of a full charging capacity of the secondary battery and a state-of-charge variation of the secondary battery, the state-of-charge variation being a deviation of a correspondence between an average state of charge in an active material of a positive electrode and a specific average state of charge in an active material of a negative electrode from the correspondence in an initial state;

the electronic control unit being configured to acquire the battery information detected by the monitoring sensor and to calculate a value of the full charging capacity of the secondary battery using the battery information;

the electronic control unit being configured to calculate a value of the rate of decrease of the full charging capacity using the value of the full charging capacity and to calculate a value of the state-of-charge variation using the value of the rate of decrease of the full charging capacity and the information; and the electronic control unit being configured to increase the lower-limit state of charge when the value of the state-of-charge variation is greater than a threshold value and to maintain the lower-limit state of charge when the value of the state-of-charge variation is less than the threshold value.

* * * * *